United States Patent [19]

De Groef

[11] 4,060,887

[45] Dec. 6, 1977

[54] MULTIPLE CONDUCTOR CONNECTOR AND METHOD OF CONNECTING CONDUCTORS TO TERMINALS THEREWITH

[75] Inventor: Pierre De Groef, Brussels, Belgium

[73] Assignee: N. V. Raychem S.A., Belgium

[21] Appl. No.: 580,940

[22] Filed: May 27, 1975

[51] Int. Cl.$^2$ .......................... H05K 3/34; H05K 1/04; H01R 17/18; H01R 43/02

[52] U.S. Cl. ........................................ 29/626; 29/628; 174/75 C; 174/DIG. 8; 339/17 C; 339/177 R; 339/275 B; 339/DIG. 1

[58] Field of Search ............ 174/DIG. 8, 88 C, 88 R, 174/86, 75 C, 84 S; 339/9 R, 7, 17R, 17 C, 177 R, 177 E, 177 L, 181 R, 181 C, 182 R, 275 R, 275 B, 276 R, 276 T, DIG. 1; 29/626, 628

[56] References Cited

U.S. PATENT DOCUMENTS

| | | | |
|---|---|---|---|
| 2,673,966 | 3/1954 | Larkin | 339/9 R |
| 3,541,495 | 11/1970 | Ellis et al. | 174/DIG. 8 UX |
| 3,743,748 | 7/1973 | Reeder | 174/DIG. 8 X |
| 3,915,535 | 10/1975 | O'Keefe et al. | 339/17 C |

FOREIGN PATENT DOCUMENTS

| | | | |
|---|---|---|---|
| 2,406,417 | 8/1974 | Germany | 339/177 R |
| 858,262 | 1/1961 | United Kingdom | 339/181 R |

*Primary Examiner*—Laramie E. Askin
*Attorney, Agent, or Firm*—Lyon & Lyon

[57] ABSTRACT

Disclosed is an electrical connector suitable for connecting a plurality of electrically conductive members to an electrical component, the connector being adjustable to the spacing of the terminals on the component. The connector comprises a plurality of hollow members slidably retained within one another and having electrically conductive members extending from one end of each hollow member for connection to the electrical component.

31 Claims, 4 Drawing Figures

MULTIPLE CONDUCTOR CONNECTOR AND METHOD OF CONNECTING CONDUCTORS TO TERMINALS THEREWITH

BACKGROUND OF THE INVENTION

The present invention relates to an article suitable for making an electrical connection between at least two electrical conductors, for example the conductors in a coaxial or shielded cable, and an electrical component, for example a printed circuit board.

Numerous methods have been proposed for making an electrical connection between coaxial cables and printed circuit boards. One previously proposed device for making such a connection comprises a pair of heat-shrinkable sleeves, each of which contains a ring of solder. An end portion of one of the sleeves is received within, and is firmly bonded to, an end portion of the other sleeve to form, in effect, a single heat-shrinkable sleeve containing two solder rings. The device includes a single preinstalled pin of round crosssection having each of its ends in a part of the sleeve and having its central region such that it can be cut to give two separate parts of the pin, which parts can be positioned in a desired place. The central region of the pin maintains the desired shape of the pin when the device is installed (by heating to cause the heat-shrinkable sleeves to shrink and the solder to fuse) on the stripped end of the coaxial cable. When the device has been installed on the cable, the pin is cut and the two parts of the pin can be inserted in appropriately spaced holes in a printed circuit board.

While the above-described device is very useful in many situations, it has the disadvantage that the spacing between the two parts of the pin obtained after cutting is determined by the shape of the pin (and thus by the manufacturer), and that a different device is therefore required for each board having a different hole spacing. This disadvantage is a considerable one as spacings on printed circuit boards are not standard: small variations can occur, for example, between metric and English system boards (a metric board, for example, having a 5 mm spacing while the corresponding English board may have a spacing of 0.200 inch = 5.08 mm), while large variations (for example from 2.54 mm (0.1 inch) to 6.35 mm (0.25 inch)) can occur between one user and another. The manufacturer is thus faced with the problem of supplying many different devices, each with a different pin.

SUMMARY OF THE INVENTION

The present invention provides an article comprising a first hollow member having first and second ends at least the first of which is open, a first electrically conductive member retained in or integral with the first hollow member, at least part of which electrically conductive member extends beyond the second end of the first hollow member, a second hollow member having first and second open ends, a second electrically conductive member retained in or integral with the second hollow member, at least part of which second electrically conductive member extends beyond one of the ends of the second hollow member, the first end of the first hollow member being slidably retained in the second hollow member, and the two electrically conductive members being electrically insulated from each other. The invention also provides a method of making an electrical connection between an electrical component and at least two electrical conductors, in which method the article of the invention is used. The article of the invention may, for example, be used in conjunction with a cable comprising at least two conductors, for example, a coaxial or shielded cable. Alternatively, it may, for example be used in conjunction with two or more non-coaxial insulated conductors, for example the conductors in a twisted pair of conductors.

PREFERRED EMBODIMENTS

Figure 1:
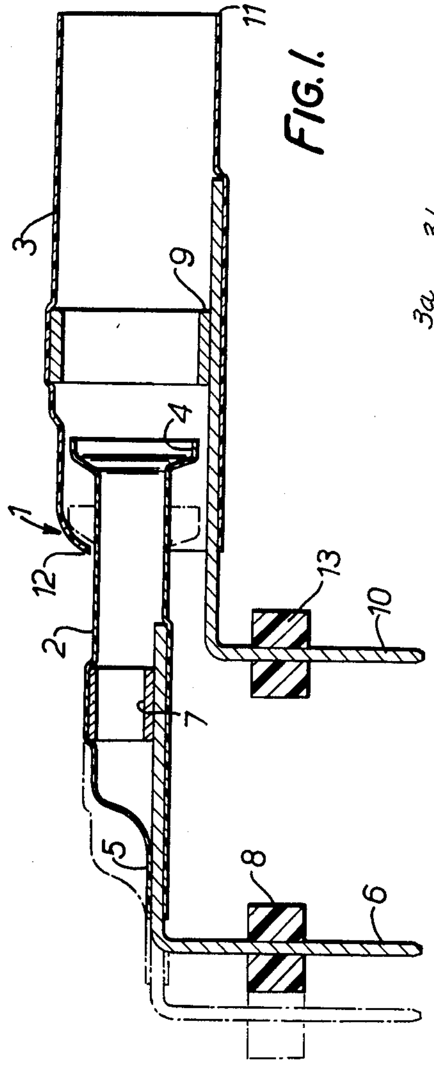
FIG. 1 is a longitudinal cross-section through the connector constructed in accordance with the invention and mounted on a pair of brackets.

As used in this specification, an "open" end is an end which is capable of receiving an electrical conductor, for example, a conductor from a coaxial or shielded conductor or one of a pair of twisted conductors thus the end of a heat-recoverable sleeve which is recovered into close contact with a pin is not open. The first hollow member is preferably slidably retained in the second hollow member in such a way that it cannot be withdrawn from the second hollow member no matter which way it is moved relative to the second hollow member. It is to be understood, however, that the expression "slidably retained" used above may include the case wherein the first hollow member cannot be completely withdrawn from the second hollow member if it is moved in one direction relative to the second hollow member, but can be completely withdrawn if it is moved in the other direction.

As the end of the first hollow member in the article of the invention that is received in the second hollow member is slidable in the latter member, the spacing between the two electrically conductive members can be adjusted (within the limits imposed by the dimensions of the article) to any desired value. The invention thus makes it possible to provide an article which can be used, for example, with printed circuit boards having different hole spacings and it is not necessary, as was previously the case, to make a separate connection device for each hole spacing.

When the article of the invention is used to make an electrical connection between, for example, a circuit board and two conductors, the spacing between the electrically conductive members may be adjusted to the desired value and the electrically conductive members may be inserted in the holes in the board and secured thereto by any desired method.

The ends of the conductors are stripped to expose a length of each of them and are inserted in the article so that one of the conductors (the inner conductor in the case of a coaxial cable) is adjacent to the first electrically conductive member and the other (the outer conductor in the case of a coaxial cable) is adjacent to the second electrically conductive member. It will be understood that stripping must be carried out in such a way that there is no electrical contact between the two conductors or between a conductor and the electrically conductive member other than the one to which it is to be electrically connected. An electrical connection is then made between each conductor and the respective electrically conductive member. In a preferred embodiment of the invention (see below) wherein each hollow member comprises a heat-shrinkable sleeve of electrically insulating material and each sleeve has a quantity of solder therein, the electrical connections can be made merely by heating the article to cause the sleeve to shrink and the solder to fuse. Where the conductors and the articles are such as to make this possible, the electrical connection between one of the conductors and the respective electrically conductive member may be made before the other conductor is positioned adjacent to its respective electrically conductive member.

The above installation steps may, if desired, be reversed, so that the article of the invention is first installed on the conductors or one of the conductors, (care being taken to maintain the desired spacing of the electrically conductive members) and the electrically conductive members are then connected to the electrical component, for example, a printed circuit board. Moreover, the article of the invention can, of course, be used for more than two conductors provided that a hollow member and an electrically conductive member is provided for each conductor. If, for example, a third hollow member is provided, the first open end of the second hollow member may, if desired, be slidably retained in an open end of the third hollow member. Thus, the invention contemplates two or more hollow members slidably retained, the number of members being equal to the conductors to be connected.

The article of the invention comprises means for preventing complete withdrawal of the first hollow member from the second hollow member in at least one direction. Advantageously, the first end of the first hollow member is captive in the second end of the second hollow member, in which case the second electrically conductive member advantageously extends beyond the second end of the second hollow member. Thus, for example, the first end of the first hollow member may comprise a portion having a larger outer diameter than the remainder of the member and/or the second end of the second hollow member may comprise a portion of smaller inner diameter than the remainder of the member. The larger or smaller diameter portion may be obtained, for example, by providing the hollow member with a flared or necked-down portion, as appropriate. Alternatively, or in addition, the outer or inner diameter of a portion of a hollow member may be modified by providing a layer of a suitable material on the exterior or interior of that portion. Thus, for example, one or more rings of thermoplastic material may be used to provide the desired modification in the diameter. The thermoplastic material is positioned, for example, on the interior of the second end of the second hollow member, that it may not only provide a portion of reduced internal diameter, but may also assist in holding the second electrically conducting member in position and form a dam to prevent the escape of molten solder (if used).

Although means such as those described above for preventing disengagement of the first and second hollow members should normally be present in the article of the invention, there may be some circumstances in which it is more convenient to supply the first and second hollow members (and associated electrically conductive members) separately so that the user can insert one in the other immediately before use. The invention therefore also provides a kit of parts which comprises a first hollow member and electrically conductive member as defined above and a second hollow member and electrically conductive member as defined above. In this case, of course, the device does not include means for preventing separation of the hollow members unless the means are such as not to prevent assembly of the device.

The first hollow member and/or the second hollow member may, if desired, comprise an electrically conductive material and may be, for example, a crimpable metal sleeve. Such a sleeve preferably has a closed cross-section but could, if desired, have a longitudinal slit therein such that it has, for example, a 'U'-or 'C'-shaped cross-section. When an electrically conductive hollow member is used, the hollow member itself may be used to form an electrical connection between the respective electrically conductive member and a conductor inserted into the hollow member, and no additional components are necessary, although means for enhancing the connection may if desired be used. When each of the hollow members is electrically conductive, insulating material must, of course, be so positioned that the hollow members are electrically insulated from each other and so that each electrically conductive member, while being maintained in electrical contact with its associated hollow member (or being maintained in such a position that it can be brought into contact with the hollow members on crimping or heat-shrinking of the hollow members), is electrically insulated from the other hollow members and the other electrically conductive member. Means may also be provided for electrically insulating from the environment the connection made when a device comprising one or more electrically conductive hollow members is installed on a cable; the insulating means may, for example, comprise one or more heat-shrinkable sleeves of electrically insulating material which is or are shrunk round the connection when the latter has been made.

Preferred mateials for crimpable sleeves to be used in the article of the invention are materials which may be used for the manufacture of electrically conductive pin members, for example, copper, brass, phosphor-bronze and beryllium copper.

Although the hollow members used in the device of the invention may be electrically conductive, at least one of the hollow member preferably comprises a heat-shrinkable sleeve of electrically insulating material; advantageously, each hollow member comprises such a heat-shrinkable sleeve. Such sleeves are relatively inexpensive, and can readily be manufactured in the desired size and shape. Thus, for example, a heat-shrinkable sleeve can readily be provided with a necked-down end portion by applying heat to the end portion to cause it to shrink while preventing shrinking of the remainder of the sleeve (for example by the insertion into the sleeve of an appropriately sized mandrel). Moreover, when heat-shrinkable sleeves of electrically insulating material are used, no additional insulating material is normally required to insulate one electrically conductive member from the other, or to insulate from the environment the connection made using the sleeve. Thus, for example, the second electrically conductive member may be positioned between the overlapping portions of the two sleeves so that it is completely insulated from the first electrically conductive member and from any conductor inserted into the first hollow member. Suitable materials for the heat-shrinkable electrically insulating sleeves used according to the invention are described in U.S. Pat. No. 3,243,211, and include, for example, cross-linked polyethylene and cross-linked polyvinylidene fluoride.

When a heat-shrinkable sleeve of electrically insulating material is used as a hollow member, the sleeve itself may, as in the case of a metal sleeve, be used in making the electrical connection between the electrically conductive member retained in that sleeve and a conductor inserted into the sleeve; in this case the heat-shrinkable sleeve is merely shrunk round the substrate (that is the electrically conductive member and the conductor) to be joined, and holds them in contact. Normally, however, it is desirable to provide additional means, preferably a quantity of solder, for enhancing the electrical connection between the substrates. The solder fuses and flows when the device is heated to cause shrinking of the heat-shrinkable sleeve and is forced by the sleeve into close contact with the substrates. The solder must normally, of course, be so positioned in the sleeve that it does not fill the entire cross-section thereof, and is advantageously in the form of a ring. The solder is suitably prefluxed.

One difficulty that is sometimes found when a heat-shrinkable sleeve (optionally together with a fusible material) is used to join two electrical conductors is that where for some reason the sleeve in its expanded state must have a particular diameter, the shrinkage ratio of the sleeve, that is, the ratio between its diameter in the expanded state and that in the non-expanded state may not be sufficient to bring the sleeve into close contact with the substrates on shrinking. This difficulty is frequently found in the previous proposed device described earlier in this specification, wherein the smaller diameter sleeve must be large enough to engage the larger diameter sleeve so that the expanded sleeve can be bonded together to form a one-piece device. In the article of the present invention, however, the first sleeve may have as small a diameter as may be desired (provided, of course, means are present to prevent it from being completely withdrawn from the second sleeve in at least one direction), thus making it possible to obtain a firm and reliable bond between the electrically conductive member in the first hollow member and a conductor inserted into that hollow member.

At least one of the electrically conductive members used in the article of the invention is advantageously such that at least a portion of that part of the member which extends beyond the open end of the respective hollow member is at an angle to the longitudinal axis of that hollow member. The electrically conductive members are preferably 90° pins so that, when using a circuit board having holes normal to the surface of the board, the hollow members in the article of the invention may lie approximately parallel to the board surface. Although electrically conductive members, e.g. pins, which are round in cross-section can be used, electrically conductive members, for example, pins which are square in cross-section, have the advantage that it is somewhat easier to prevent rotation of electrically conductive members when installing the article of the invention. Each electrically conductive member is advantageously retained in the respective hollow member in such a way that substantially no axial or rotational displacement of the electrically conductive member relative to the hollow member is possible. This may be achieved, for example, by means of an adhesive or, in the case of a heat-shrinkable first hollow member, by shrinking the second end portion of the hollow member into firm contact with the electrically conductive member, the strength of the bond formed being enhanced, if desired, by a quantity of thermoplastic material. Alternatively, or in addition, the first and/or second electrically conductive member may be held firmly between the respective hollow members and an insert, for example a ring of solder and/or a ring of thermoplastic material, positioned within the hollow member. In the latter case a heat-shrinkable hollow member may, during manufacture of the article, be positioned around the insert(s) and the electrically conductive member and partially recovered so that it tightly grips the insert(s) and the electrically conductive member. Materials from which pins can be made include, for example, copper, brass, phosphorbronze and beryllium copper.

In the case of an electrically conductive hollow member, although any of the above-described methods may be used for retaining the electrically conductive member in the hollow member, the electrically conductive member is preferably formed in one piece with the hollow member. Thus, for example, the electrically conductive member and the hollow member may be stamped out of sheet metal.

Each electrically conductive member used according to the invention is preferably, if it is not formed integrally with the respective hollow member, so mounted in that hollow member that the axis of that portion of the electrically conductive member that is within the member is substantially parallel to the longitudinal axis of the hollow member. Advantageously, however, the axis of the electrically conductive member does not coincide with the axis of the hollow member so that the electrically conductive member is eccentric with respect to the hollow member. This has the advantage of making it easier to insert a conductor into the hollow member and of making it possible for the electrically conductive member to be as close as possible to, for example, a printed circuit board so that a connection to the board made may be as strong as possible.

If it is desired to install the article of the invention on a cable before installing it on, for example, a printed circuit board, the article may be so constructed that no rotation of one hollow member relative to the other is possible during installation so that the alignment of the electrically conductive members of the device is not disturbed during installation. Thus, for example, the hollow members may be of such a cross-section (for example, square) that no rotation is possible. Alternatively, or in addition, a plurality of articles according to the invention may be mounted on one or more support members or brackets. Thus, for example, the first electrically conductive member of each of a number of articles according to the invention may pass through a respective hole in a first bracket while in addition, or alternatively, the second electrically conductive members pass through holes in a second bracket. The use of such brackets not only has the advantage mentioned above, but also has the advantage that the brackets may provide strain relief to the electrically conductive members if the articles are installed on the board before being installed on the cable. Furthermore, the use of brackets makes it possible to make a plurality of connections quickly and easily and, if desired, automatically. A plurality of articles of the invention mounted on one or more brackets may form a paddle card termination device with variable spacing, and such a device is also provided by the present invention.

The article of the invention may be made by any suitable method. One such method involves providing or forming the second hollow member with the second electrically conductive member, providing the first hollow member and/or the second hollow member with retaining means, introducing the second end of the first hollow member into the first end of the second hollow member, pushing the first hollow member through the second hollow member until the first hollow member extends out of the second end of the second hollow member, and, if the first electrically conductive member is not formed integrally with the first hollow member, installing the first electrically conductive member in the first hollow member. The precise method of carrying out each of those steps will of course depend on the nature of the various components of the article, but will not present any difficulty to those skilled in the art.

As well as having the advantage outlined above, namely of making it possible to use a single device for boards with different hole spacings, the article of the invention also has the advantage that it may in some cases be used to make a connection between a cable and a printed circuit board which connection has an impedance which is acceptably close to the impedance of the cable. Thus, it has been found that when a cable comprising an inner conductor and an outer conductor is connected to a printed circuit board by means of an article according to the invention, the second electrically conductive member may to some extent continue the shielding provided by the outer conductor and, if the distance between the first and second electrically conductive members is correctly chosen, a surprisingly good impedance match may be obtained. Thus, in circumstances where the spacing between the electrically conductive members is not restrained to a particular value by the hole spacing on the circuit board, the manufacturer can indicate to the user of the device what spacing between the electrically conductive members should be used to give the best impedance match for a given cable. The present invention therefore also provides a method of making an electrical connection between a printed circuit board and a cable comprising an inner conductor and an outer conductor, which method involves using the article of the invention. In particular the invention provides such a method in which the spacing between the electrically conductive members in the article of the invention is so chosen that the impedance of the connection is as close as possible to that of the cable.

Further advantages of the article of the invention are that the hollow members may provide strain relief at the connection and, where a heat-shrinkable insulating sleeve containing a quantity of solder is used, that the sleeve itself provides insulation for the connection, and that the amount of solder can be selected by the manufacturer, and not left to the judgement of the person installing the sleeve. Moreover, the article is quick and easy to install, especially in the case where heat-shrinkable sleeves containing solder are used.

The invention will now be described, by way of example only, with reference to the accompanying drawings.

Referring now to the drawings, FIG. 1 shows a connecting device 1 which comprises a first sleeve 2 and a second sleeve 3 of heat-shrinkable electrically insulating material (for example, irradiation cross-linked polyvinylidene fluoride). The first sleeve 2 has an enlarged diameter portion 4 at a first end thereof and, at the opposite end, 5, is shrunk into contact with a 90° bent pin 6 of square cross-section. The pin 6 may be made, for example, of tinned Phosphor-bronze. The pin 6 is prevented from moving relative to the sleeve 2 by the shrunk end portion 5 and by a ring 7 of prefluxed solder which is contained within the sleeve 2; the pin 6 is sandwiched between the sleeve 2 and the solder ring 7. The downwardly extending portion of the pin is a force fit in a hole in a bracket 8.

The second sleeve 3 is, like the first sleeve 2, also provided with a ring of prefluxed solder, 9, and a 90° bent pin, 10. The pin 10 is retained in position in the sleeve 3 by the sleeve 3 and the solder ring 10. A first end 11 of the sleeve 3 is open to receive a cable (not shown), while the second end has a constricted portion 12 which cooperates with the enlarged diameter portion 4 of the first sleeve 2 to prevent the first end of the first sleeve 2, which is slidingly received in the second end of the second sleeve 3, from being completely withdrawn therefrom. As indicated by the dotted lines in FIG. 1, sliding of the sleeve 2 in the sleeve 3 permits adjustment of the spacing between the pin 6 and the pin 10.

Figure 2:
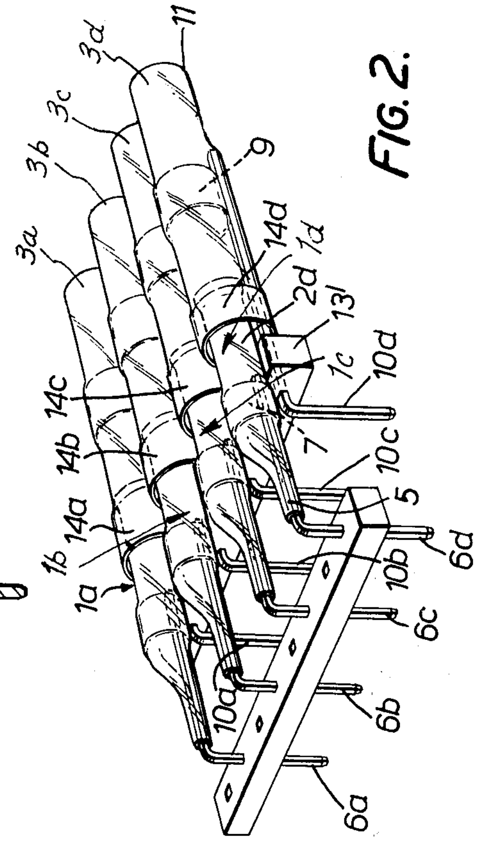
FIG. 2 is a view of a plurality of connectors mounted on a pair of brackets.

In the device shown in FIG. 1, the downwardly extending portion of the pin 10 is a force fit in a hole in a bracket 13. If desired, the bracket 13 may be replaced by a bracket (not shown) through which a horizontal portion of the pin passes. The brackets 8 and 13' can be seen more clearly in FIG. 2, which is a view of four devices of the invention mounted on brackets 8 and 13 to form a paddle card termination device with variable spacing. The devices, *1a* to *1d* shown in FIG. 2 are generally similar to the device 1 in FIG. 1 except that each of the second sleeves, *3a* to *3d*, includes a ring, *14a* to *14d* of fusible thermoplastic material at the second end thereof. These rings assist in holding pins *10a* to *10d* in position in the respective second sleeve, provide a portion of reduced internal diameter at the second end of that sleeve, and, when the device is heated to cause the sleeves to shrink and the solder to fuse, melt and form a dam for the solder to prevent it escaping beyond the end of the sleeves *3a* to *3d*. It should be noted that sleeves used in the device illustrated in FIG. 2 are transparent, and that the rings of solder and thermoplastic material can be seen through the transparent sleeves. The rings *14a* to *14d* may, for example, comprise any of the fusible thermoplastic materials described in British Patent Specification No. 1,062,043.

Figure 3:
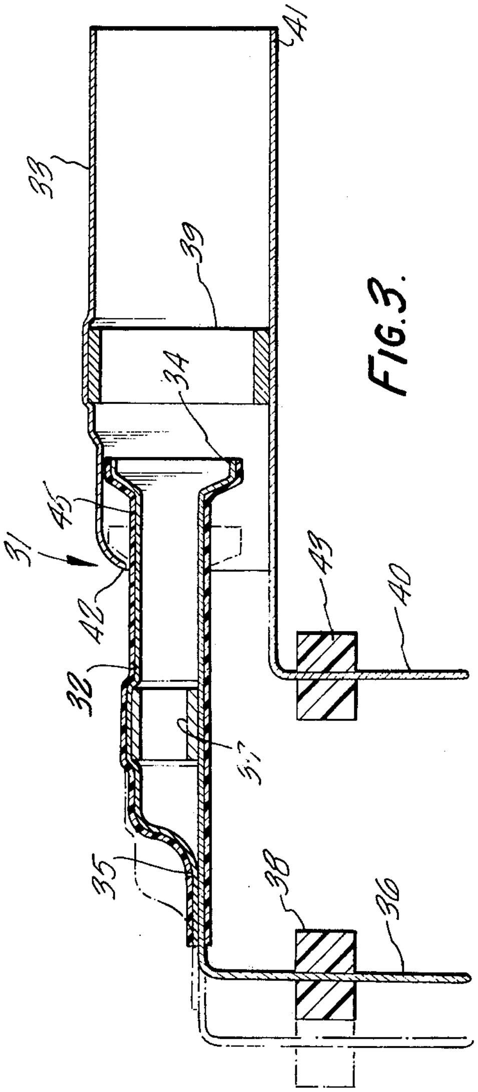
FIG. 3 is a longitudinal cross-sectional view similar to FIG. 1 where the two hollow members are crimpable metallic sleeves having insulation between the sleeves and in which the electrically conductive members are integral with the sleeve.

FIG. 3 shows a connecting device 31 which comprises a first crimpable metallic sleeve 32 and a second crimpable metallic sleeve 33. The first sleeve 32 has an enlarged diameter portion 34 at a first end thereof and, at the opposite end, 35, is shrunk and forms a 90° bent pin portion 36 of square cross-section. A ring 37 of prefluxed solder which is contained within the sleeve 32 enhances the electrical connection between the crimpable metallic sleeve 32 and the cable not shown. The downwardly extending portion of the pin is a force fit in a hole in a bracket 38.

The second sleeve 33 is, like the first sleeve 32, also provided with a ring of prefluxed solder, 39, and forms a 90° bent pin portion, 40. A first end 41 of the sleeve 33 is open to receive a cable (not shown), while the second end has a constricted portion 42 which cooperates with the enlarged diameter portion 34 of the first sleeve 32 to prevent the first end of the first sleeve 32, which is slidingly and adjustably received in the second end of the second sleeve 33, from being completely withdrawn therefrom. Insulation material 45 covers the external portion of crimpable metallic sleeve 32. As indicated by the dotted lines in FIG. 3, sliding of the sleeve 32 in the sleeve 33 permits adjustment of the spacing between the pin portion 36 and the pin portion 40. In the device shown in FIG. 3, the downwardly extending portion of the pin 40 is a force fit in a hole in a bracket 43.

Figure 4:
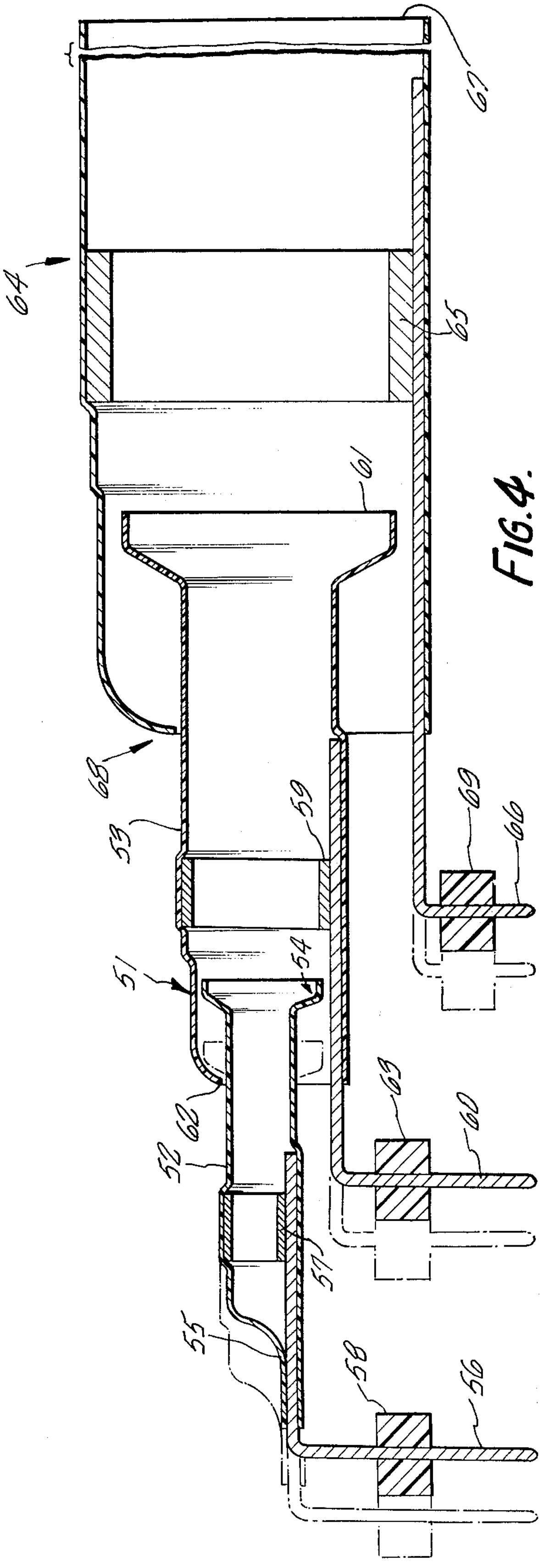
FIG. 4 is a longitudinal cross-sectional view similar to FIG. 1 but showing three hollow members arranged for connecting three electrical conductors of a triaxial cable.

FIG. 4 shows a connecting device 51 which comprises a first sleeve 52 and a second sleeve 53 of heat-shrinkable electrically insulating material (for example, irradiation cross-linked polyvinylidene fluoride). The first sleeve 52 has an enlarged diameter portion 54 at a first end thereof and, at the opposite end, 55, is shrunk into contact with a 90° bent pin 56 of square cross-section. The pin 56 may be made, for example, of tinned Phosphor-bronze. The pin 56 is prevented from moving relative to the sleeve 52 by the shrunk end portion 55 and by a ring 57 of prefluxed solder which is contained within the sleeve 52; the pin 56 is sandwiched between the sleeve 52 and the solder ring 57. The downwardly extending portion of the pin is a force fit in a hole in a bracket 58.

The second sleeve 53 is, like the first sleeve 52, also provided with a ring of prefluxed solder, 59, and a 90° bent pin, 60. The pin 60 is retained in position in the sleeve 53 by the sleeve 53 and the solder ring 59. An enlarged diameter portion 61 is at the first end of the second sleeve while the second end has a constricted portion 62 which cooperates with the enlarged diameter portion 54 of the first sleeve 52 to prevent the first end of the first sleeve 52, which is slidingly and adjustably received in the second end of the second sleeve 53, from being completely withdrawn therefrom. As indicated by the dotted lines in FIG. 4, sliding of the sleeve 52 in the sleeve 53 permits adjustment of the spacing between the pin 56 and the pin 60. The downwardly extending portion of the pin 60 is a force fit in a hole in a bracket 63.

The third sleeve 64 is, like the first and second sleeves, 52 and 53, also provided with a ring of prefluxed solder, 65, and a 90° bent pin 66. The pin 66 is retained in position in the sleeve 64 by the sleeve 64 and the solder ring 65. A first end 67 of the sleeve 64 is open to receive a cable (not shown), while the second has a constricted portion 68 which cooperates with the enlarged diameter portion 61 of the second sleeve 53 to prevent the first end of the second sleeve 53, which is slidingly and adjustably received in the second end of the third sleeve 64, from being completely withdrawn therefrom. The sliding of the sleeve 53 in sleeve 64 permits adjustment of the spacing between pin 60 and pin 66. In the device shown in FIG. 4, the downwardly extending portion of the pin 66 is a force fit in a hole in a bracket 69.

I claim:

1. An electrical connector comprising a first hollow member having first and second ends at least the first of which is open, said first hollow member having associated therewith a first electrically conductive member, at least part of which first electrically conductive member extends beyond the second end of the first hollow member, said first hollow member being adapted to receive a first electrical conductor and providing means for electrically connecting said first conductor to said first conductive member, a second hollow member having associated therewith a second electrically conductive member, at least part which second electrically conductive member extends beyond one of the ends of the second hollow member, said second hollow member being adapted to receive a second electrical conductor and providing means for electrically connecting said second conductor to said second conductive member, the first end of the first hollow member being slidably and adjustably retained in the second hollow member, and the two electrically conductive members being electrically insulated from each other.

2. The electrical connector of claim 1 wherein the first and second electrically conductive members are integral with the first and second hollow members, respectively.

3. The connector of claim 1 wherein the first and second hollow members are so configured that the first end portion of the first hollow member is captively retained within the second hollow member.

4. The connector of claim 1 wherein the first hollow member comprises an electically conductive material.

5. The connector of claim 4, wherein the first hollow member comprises a crimpable metal sleeve.

6. The connector of claim 1 wherein the second hollow member comprises an electrically conductive material.

7. The connector of claim 6 wherein the second hollow member comprises a crimpable metal sleeve.

8. The connector of claim 1 wherein the first hollow member comprises a heat-shrinkable sleeve of electrically insulating material.

9. The connector of claim 8, wherein the heat-shrinkable sleeve is provided with a quantity of solder on its surface, said solder being forced by the sleeve into close contact with the electrically conductive member and the conductor upon the application of heat.

10. The connector of claim 1 wherein the second hollow member comprises a heat-shrinkable sleeve of electrically insulating material.

11. The connector of claim 10 wherein the heat-shrinkable sleeve is provided with a quantity of solder on its surface, said solder being forced by the sleeve into close contact with the electrically conductive member and the conductor upon the application of heat.

12. The connector of claim 1 wherein at least one of the electrically conductive members is such that at least a portion of that part of the member which extends beyond the respective hollow member is at an angle to the longitudinal axis of that member.

13. The connector as claimed in claim 12 wherein the first electrically conductive member comprises a pin shaped to form a 90° angle.

14. The connector of claim 12 wherein the second electrically conductive member comprises a pin shaped to form a 90° angle.

15. The connector of claim 1 wherein each electrically conductive member is sandwiched between its respective hollow member and a respective insert.

16. The connector of claim 15 wherein each insert comprises a ring of solder.

17. The connector of claim 1 wherein at least one of the electrically conductive members is so mounted in the respective hollow member that the axis of that portion of the at least one electrically conductive member that is within the respective hollow member is substantially parallel to but is offset from the longitudinal axis of the respective hollow member.

18. The electrical connector of claim 1 which also comprises a third hollow member having first and second open ends, said third hollow member having associated therewith a third electrically conductive member, at least part of which third electrically conductive member extends beyond one of the ends of the third hollow member, said third hollow member being adapted to receive a third electrical conductor and providing means for electrically connecting said third conductor to said third conductive member, the first end of the second hollow member being slidably and adjustably retained in the third hollow member, the third electrically conductive member being electrically insulated from the first and second electrically conductive members.

19. The electrical connector of claim 18 wherein the third electrically conductive member is integral with the third hollow member.

20. The article of claim 1 wherein a portion of each electrically conductive member outside the hollow member is inserted through a support member.

21. An electrical connector according to claim 1 where both the first and second conductive members are separate from but retained within the first and second hollow members respectively.

22. An electrical connector comprising a first hollow member having a first end through which passes a first electrically conductive member and a second hollow member having a first end through which passes a second electrically conductive member, at least one of said electrically conductive members terminating in a pin at a substantially 90° angle from the axis of its associated hollow member, and said electrically conductive members being retained in their respective hollow members by means of insert rings, said electrically conductive members being sandwiched between the inner surface of the respective hollow member and the respective ring and the second end of the first hollow member being slidably retained in the first end of the second hollow member.

23. A kit of parts for making an electrical connection which comprises a first hollow member having first and second ends at least the first of which is open, said first hollow member having associated therewith a first electrically conductive member, at least part of which first conductive member extends beyond the second end of the first hollow member, said first hollow member being adapted to receive a first electrical conductor and providing means for electrically connecting said first conductor to said first conductive member; and a second hollow member having associated therewith a second electrically conductive member, at least part of which second electrically conductive member extends beyond one of the ends of the second hollow member, said second hollow member being adapted to receive a second electrical conductor and providing means for electrically connecting said second conductor to said second conductive member, the first end of said first hollow member and the second end of the second hollow member each having a means for preventing the disengagement while slidably and adjustably retaining said first hollow member within said second hollow member, said first and second electrically conductive members being electrically insulated from each other.

24. The kit of claim 23 wherein the first and second conductive members are separate from but retained within the first and second hollow members respectively.

25. The kit of claim 23 wherein the first and second conductive members are integral with said first and second hollow members respectively.

26. A method for electrically connecting each of first and second electrical conductors to a different terminal in an electrical component having at least two spaced terminals comprising:

a. inserting said first conductor into the first end of a first hollow member having first and second ends at least the first of which is open, said first hollow member having associated therewith a first electrically conductive member, at least part of which first electrically conductive member extends beyond the second end of the first hollow member, said first hollow member providing means for electrically connecting said first conductor to said first conductive member;

b. inserting said second conductor into the first end of a second hollow member having associated therewith a second electrically conductive member, at least part of which second electrically conductive member extends beyond one of the ends of the second hollow member, said second hollow member providing means for electrically connecting said second conductor to said second conductive member, said second hollow member having the first end of the first hollow member slidably retained therein;

c. slidably adjusting the first and second hollow members to position said first and second conductive members for connection to separate spaced terminals;

d. electrically connecting said first conductor to said first conductive member and said second conductor to said second conductive member; and e. electrically connecting said first and second conductive members to respective spaced terminals.

27. A method as claimed in claim 26, wherein the electrical component is a printed circuit board and the terminals are circular conductive orifices through which each electrically conductive member is inserted.

28. A method as claimed in claim 26 wherein the two electrical conductors are the inner end and the outer conductors of a coaxial cable.

29. A method according to claim 26 wherein the first and second electrical conductors are the inner and outer conductors of coaxial cable and the first and second hollow members are slidably adjusted such that the impedance of the connections of the conductors to the terminals of the electrical component substantially matches that of the cable.

30. The method according to claim 26 wherein the first and second conductive members are separate from but retained within the first and second hollow members respectively.

31. The method according to claim 26 wherein the first and second conductive members are integral with said first and second hollow members respectively.

* * * * *